(12) United States Patent
Gallegos

(10) Patent No.: US 7,808,113 B2
(45) Date of Patent: Oct. 5, 2010

(54) FLIP CHIP SEMICONDUCTOR DEVICE HAVING WORKPIECE ADHESION PROMOTER LAYER FOR IMPROVED UNDERFILL ADHESION

(75) Inventor: Bernardo Gallegos, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 203 days.

(21) Appl. No.: 12/171,026

(22) Filed: Jul. 10, 2008

(65) Prior Publication Data

US 2010/0007032 A1    Jan. 14, 2010

(51) Int. Cl.
*H01L 29/40* (2006.01)

(52) U.S. Cl. .............. 257/778; 257/783; 257/753; 257/773; 257/789; 257/E23.069; 257/E23.018; 438/109

(58) Field of Classification Search .......... 257/678–796, 257/E23.001–E23.194; 438/83, 98, 100, 438/101, 111, 112, 123, 124, 411, 412, 461, 438/584, 597–688, FOR. 340–FOR. 384, 438/FOR. 417

See application file for complete search history.

(56) References Cited

U.S. PATENT DOCUMENTS

| | | | | |
|---|---|---|---|---|
| 6,586,683 B2 * | 7/2003 | Arrington et al. | ............ | 174/255 |
| 2002/0189853 A1 * | 12/2002 | Hsu | ............ | 174/252 |

* cited by examiner

*Primary Examiner*—Jasmine J Clark
(74) *Attorney, Agent, or Firm*—Yingsheng Tung; Wade J. Brady, III; Frederick J. Telecky, Jr.

(57) ABSTRACT

A semiconductor device assembly (200) includes a workpiece (205) having a surface including a die attach region corresponding to regions under an integrated circuit (IC) die 210. The die attach region of workpiece (205) includes non-noble metal surfaces (215) and a plurality of flip chip (PC) pads at pad locations (214). A solder mask layer (207) is on a surface of the workpiece (205) outside the die attach region. The non-noble metal surfaces (215) in the die attach region include an adhesion promoter layer (221), wherein the adhesion promoter layer 221 is absent from the plurality of PC pads (214). An integrated circuit (IC) die (210) having a plurality of bumps (211) bonded in a flip chip arrangement to the workpiece (205). An underfill material (232) fills a space between the bumped IC die (210) and the workpiece (205).

18 Claims, 3 Drawing Sheets

| 101 | Applying a masking material pattern for defining the location of a metal layer onto a surface of a workpiece. |

| 102 | Forming a patterned metal comprising layer using the pattern to form a plurality of metal comprising traces. |

| 103 | Stripping the masking material, and in the case of copper traces, flash etching the blanket copper seed layer which is underneath the masking material. |

| 104 | Forming a solder mask layer on the workpiece, but not in the die attach area(s) the bumped IC die(s) will be attached. |

| 105 | Applying a masking material to block areas that will be under the IC die, except where FC pads are to be formed (both periphery and core pads). |

| 106 | Forming a metal comprising layer in the FC pad area. |

| 107 | Removing the masking material. |

| 108 | Forming an adhesion promoter layer in areas that will be under the IC die, but not on the FC pad areas. |

| 109 | Attaching the bumped IC die(s) in an FC arrangement to the workpiece. |

| 110 | Filing the space between the bumped IC die and the workpiece with an underfill material. |

FLIP CHIP SEMICONDUCTOR DEVICE HAVING WORKPIECE ADHESION PROMOTER LAYER FOR IMPROVED UNDERFILL ADHESION

FIELD OF THE INVENTION

The present invention is related in general to the field of semiconductor devices and packaging of semiconductor devices, and more specifically to flip-chip (FC) package comprising devices having improved adhesion of underfill to a substrate surface.

BACKGROUND

The FC package is an advanced packaging technique for connecting an integrated circuit (IC) die to a substrate, such as printed circuit board (PCB). During the packaging process, the IC die is turned upside down to connect to the IC die to the metal bond pads on the substrate and hence the metal conductive wires of the substrate.

The FC package generally comprises at least one substrate, a semiconductor die including a plurality of bumps, an underfill layer, and a plurality of solder balls. The substrate is commonly a dielectric material with two sides that have respectively a first metal interconnect layer including bond pads and a second metal interconnect layer. The first and the second metal interconnect layers respectively have a plurality of metal conductive wires located therein, and are electrically connected by a plurality of vias. The surface of the substrate generally includes a dielectric solder mask material in areas outside the bond pads. The solder mask over conventional copper traces prevents copper oxidation, masks against solder spreading around the solder joints and provides enhanced adhesion to the underfill. The circuit side (positive side) of the IC die has a plurality of die pads. Under bump metallurgy (UBM) is generally formed on the die pad surface before forming the bumps thereon.

The flipped IC die is generally bonded by soldering or an ultrasonic process (e.g. in the cases of Au—Au) to the bond pads of the first metal interconnect layer of the substrate (referred to as FC pads) through the bumps on the IC die surface. As used herein, any Au comprising stud to Au comprising surface interconnection is referred to as "Au—Au bonding". In either case, the bonding is referred to as a "solder joint". Then an underfill layer is formed in the gap region between the IC die and the substrate. Underfill generally comprises a polymeric material, such as a silica-filled epoxy resin. The function of the underfill is to reduce the stress in the solder joints caused by the coefficient of thermal expansion (CTE) mismatch.

"Soldering" is a first FC bonding method which generally refers to a thermal profile (reflow). This first bonding method does involve ultrasonic processing. A typical case for the first FC bonding method is for larger ASIC packages, which use solder on both the bumps of the IC die and on the FC pads of the substrate.

A second FC bonding method is Au—Au bonding which generally comprises a Au stud bump on the IC die that is attached to a Ni/Au surface on the surface of the FC pads of the substrate. This second bonding technique generally uses ultrasonic processing and thus does not require solder on the IC die or on the substrate.

There is third FC bonding method which uses a Au stud bump on the IC die which is bonded to solder finished FC pads. For this type of bonding although a Au stud on the IC die is used. This FC bonding is generally performed with thermal reflow such as described above for the first FC bonding method.

In general, for the first and third PC bonding methods the gap distance between bottom surface of IC die and top of substrate is large enough to not generally have significant problems in properly underfilling the gap region. The reason for this is because for solder comprising FC bonding, the IC die(s) tend to be larger, and for this reason the distance from center-to-center of the die pads is relatively large which allows the die-to-substrate connections to be larger, thus producing a larger top of soldermask to bottom of die space. This allows the soldermask layer to be placed on the substrate in the area under the IC die and still generally properly underfill the gap region with underfill.

However, in the second PC bonding method (Au—Au bonding), the solder joints are gold comprising including gold from both the bumped IC and gold from the flip chip pads on the substrate. Particularly in the case of FC Au—Au bonding technology, a very small gap results between the bottom of the die and the top of the substrate as a result of the Au stud collapse onto the EC pads on the substrate. With the solder mask layer on the substrate the gap between the IC die and the substrate for FC Au—Au bonding technology is generally about 5 µm. By not including a solder mask layer on the substrate the gap for FC Au—Au bonding technology can be increased to about 15 µm.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The presence of underfill material can make the flip-chip (FC) packaging system susceptible to interfacial failure. Good adhesion of the under-fill to both the passivation layer generally on the IC chip and the substrate surface is generally needed for reliability of an underfilled FC package. As used herein, the substrate will be referred to as a "workpiece" which is understood to generally include one or more circuit board substrates (e.g. PCBs) or an IC die.

Although the solder mask layer over conventional copper traces is helpful for preventing oxidation of the Cu traces, masking against solder spreading around the solder joints in the case of a solder process, and providing enhanced adhesion to the underfill, the present Inventor has recognized that the solder mask layer under the die reduces the gap between the bottom of the IC die and the top of the substrate. The present inventor has also recognized that if the solder mask layer is removed, adhesion problems to the surface of the workpiece can result, particularly to copper or other oxidizable metal regions, primarily due uncontrolled oxidation (corrosion), such as from moisture in the ambient.

Particularly in the case of Au—Au bonding technology due to Au stud collapse to the Au stud bump on the bond pad on the workpiece during bonding, a very small gap between bottom of the IC die and top surface of workpiece results. As the gap is reduced, the challenge of proper underfill flow underneath the IC die increases, generally producing underfill voids in tight areas concentrated mostly in the center of the package under the die, which can lead to reliability failures.

One solution can be to remove the soldermask layer from the workpiece top side surface in areas under the IC die since this would increase the height of the gap between the IC die and the workpiece. However, particularly when a solder masking layer is not present on the workpiece surface, the present Inventor has observed that the adhesion between the workpiece surface and the underfill can worsen. For example, in the case of copper, without a solder mask layer on the surface of the copper interconnect, the copper can oxidize and result in poor adhesion and resulting delamination between the workpiece and the underfill.

Embodiments of the present invention provide increased adhesion of underfill to substrate which allows elimination of the soldermask layer under the IC die for an increased gap which aids in underfill flow. Although also generally useful for a variety of solder interconnections, embodiments of the present invention are particularly helpful for FC Au—Au bonding technology due to stud collapse which further reduces the gap otherwise available.

Some embodiments of the present invention include selectively forming the adhesive promoter layer on the workpiece surface in the die attach area, but not on the FC pads. The adhesive promoter layer has been found by the present Inventor to allow the solder mask layer to be absent in areas of the workpiece surface corresponding to areas beneath the bumped IC die, thus increasing the height of the gap between the IC die and the workpiece. The increased gap reduces the challenge of the underfill flow underneath the IC die, generally producing reduced underfill voids particular significant in tight areas including in the center of the package under the die, leading to improved reliability. Embodiments of the invention thus can effectively solve both the problem of the gap between the IC die and the workpiece being too small to properly underfill by removing the gap reducing thickness of the solder mask layer on the workpiece under the die, without the problems that generally arise without a solder mask layer including poor adhesion and uncontrolled oxidation (corrosion).

Although particularly helpful for Au—Au bonding technology, embodiments of the present invention are not limited to Au—Au bonding technology. For example, embodiments of the invention generally also apply to solder comprising technology. For example, as the die pad pitch decreases, even for solder comprising FC bonding methods (FC bonding methods 1 and 3 described in the background) there may be a need to remove soldermask from the workpiece in areas beneath the bumped IC die to increase the gap even in the absence of Au stud collapse.

BRIEF DESCRIPTION OF THE DRAWINGS

FIG. 1 is a flow chart for an exemplary FC assembly method according to an embodiment of the invention.

DETAILED DESCRIPTION

Figure 2:
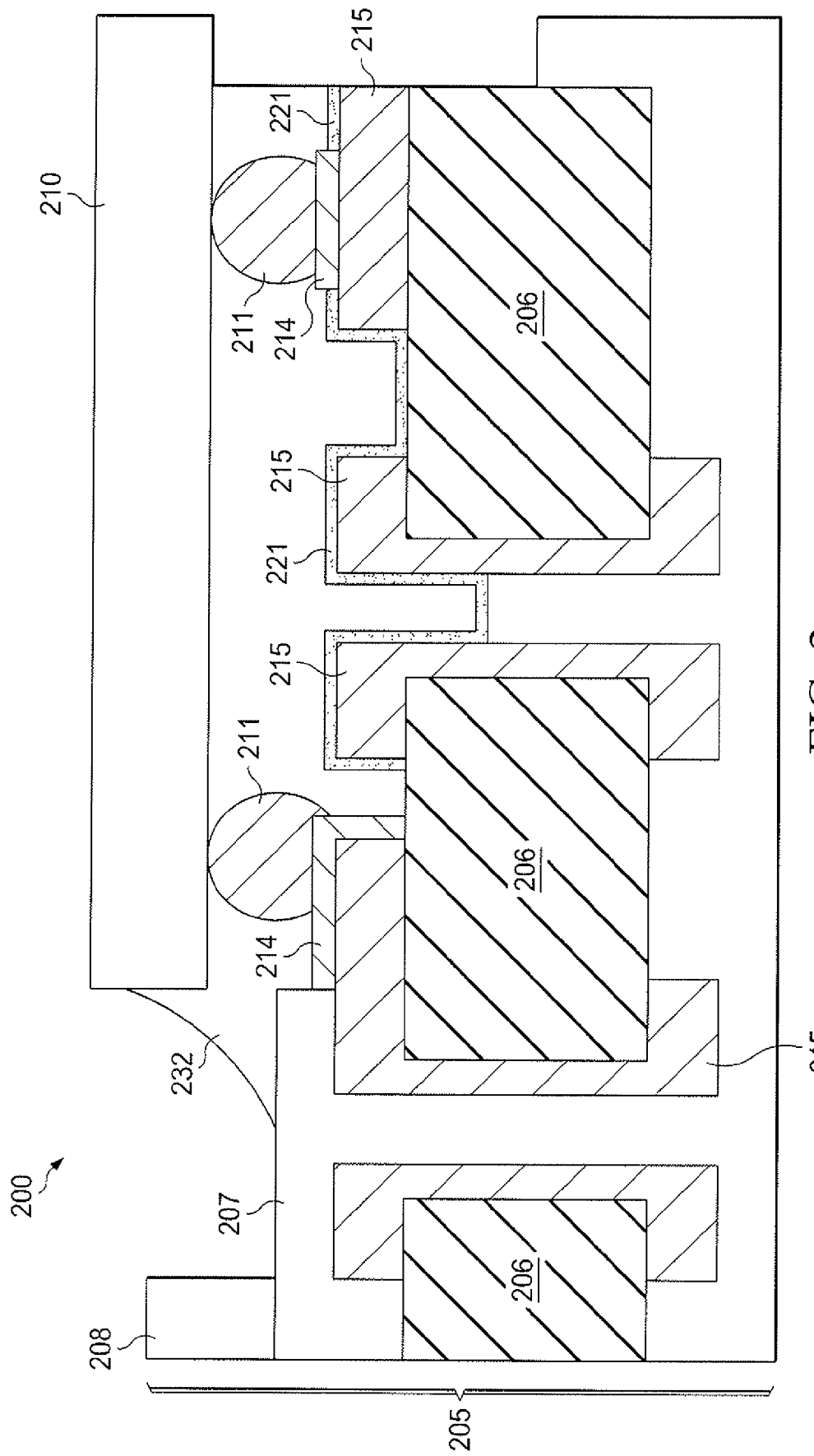
FIG. 2 shows a semiconductor device assembly in a chip scale package (CSP) arrangement according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention.

The present invention is not limited by the illustrated ordering of acts or events, as some acts may occur in different orders and/or concurrently with other acts or events. Furthermore, not all illustrated acts or events are required to implement a methodology in accordance with the present invention.

The present Inventor has discovered that adding an adhesive promoter layer onto the surface of metal (e.g. an oxidizable metal such as copper) to workpiece areas under the IC die promotes better adhesion of underfill to the substrate surface. The adhesive promoter layer can also act as a non-oxidizable surface finish that prevents an oxidizable metal (e.g. Cu) surface from further oxidizing due to unpredictable environment conditions. Moreover, the adhesion promoter layer allows the solder mask layer on the workpiece to be eliminated under the die, thus increasing the height of the gap between the IC die and the workpiece. The increase height has been found by the present Inventor to reduce underfill voids particularly significant in tight areas in the center of the package under the IC die, leading to improved reliability. The adhesion promoter layer is generally excluded from the EC pad area.

In one embodiment, FC methods according to embodiments of the invention are described herein for assembling a noble metal comprising bumped IC die to a workpiece having a surface including non-noble metal regions and a plurality of noble metal comprising flip chip pad locations. In another embodiment, FC methods according to embodiments of the invention are described herein for assembling a bumped IC die to a workpiece having FC pads where at least one of the die bumps and FC pads comprise solder. Semiconductor device assemblies related to FC methods according to embodiments of the invention are also provided.

FIG. 1 is a flow chart showing steps for an exemplary FC assembly method 100 according to an embodiment of the invention. The new processes steps described below can generally be performed with standard equipment and materials already used in the semiconductor industry. In step 101 a masking material pattern is applied for defining the location of a metal layer onto a surface of a workpiece. The masking layer can be photoresist or another suitable masking material. Step 102 comprises forming a patterned non-noble metal comprising layer including a plurality of metal comprising traces. In one embodiment, step 102 can comprise plating, such as Cu plating. The metal comprising layer is formed to generally provide a specified thickness range. In step 103 the masking material is stripped off, and in the case of copper traces, flash etching is performed to remove the blanket copper seed layer underneath the masking layer (e.g. photoresist).

Step 104 comprises forming a dielectric solder mask layer on the workpiece, but not in the area(s) the bumped die(s) will be attached. As known in the art, a surface preparation clean can be included in preparation for soldermask process. The solder mask can be applied either by a liquid resist or a dry film soldermask. An example of a liquid soldermask is Taiyo AUS320 and example of dry film mask is Taiyo AUS410 (TAIYO AMERICA, INC., Carson City, Nev., a manufacturing subsidiary of TAIYO INK MFG. CO., LTD. (Japan). Step 105 comprises applying a masking material (e.g. photoresist)

to block areas on the workpiece that will be under the IC die, except where the FC pads are to be formed, including both periphery and core pads. In step 106 a metal comprising layer is formed in the FC pad area. In one embodiment, a noble metal comprising layer, such as Ni/Au, is formed, for example by electroplating. In another embodiment, a non-noble metal comprising layer, such as a solder comprising layer, is formed in the FC pad area. As known in the art, solder generally comprises primarily Sn (tin). Step 107 comprises removing the masking material (e.g. resist strip).

In step 108, an adhesion promoter layer is formed in areas of the workpiece that will be under the IC die, but not on the FC pad areas. In one embodiment, the selective adhesion promoter layer can be formed by a blanket process (deposition on all surfaces) followed by a selective removal process. In the case of a blanket process, the thickness of the adhesion promoter layer will generally be <50% of the thickness of the solder mask layer on the surface of the workpiece outside the die area so that the gap is significantly increased compared to if a conventional solder mask layer were present under the die.

In another embodiment, the adhesion promoter layer is formed by a direct selective formation process that will generally increase the gap by the full thickness of the solder mask layer as compared to the resulting gap if a conventional solder mask layer were present under the die. The selective formation process can comprise processing the workpiece under conditions to selectively chemically convert a surface of the workpiece outside the FC pad area that includes oxidizable metal (e.g. copper) to form a roughened non-oxidizable adhesion promoter layer, but not affect the FC pad surface. Generally, in the case of a noble metal comprising layer on the FC pads, the noble metal layer generally remains unreacted by the selective formation processing. In addition, in the case of a solder comprising layer on the FC pads, the solder comprising layer generally also remains unreacted by the selective formation processing. In either case, the solder mask layer generally on the workpiece outside of the die area also generally remains unchanged by the adhesion promoter layer selective formation process.

The adhesion promoting layer can be comprised of a coupling agent, or a porous or surface roughened metal compound (e.g. metal oxide). Suitable coupling agents that can generally be used with embodiments of the invention include certain silanes. Suitable silane coupling agents can include, but are not generally limited to, Dow-Corning Z-6040, 3-glycidoxypropyltrimethoxysilane, Dow-Corning Z-6032, N-2 (vinylbenzylamino)-ethyl-3-aminopropyltrimethoxysilane, cationic styrylamine trimethoxysilane, Dow-Corning Z-6020, aminoethylaminopropyltrimethoxysilane, Dow-Corning Z-6030, 3-methacryloxypropyltrimethoxysilane, and Dow-Corning Z-6011, 3-aminopropyltriethoxysilane. These coupling agents can be suitably applied according to the manufacturer's instructions. These silane coupling agents are available from Dow Corning Corporation (Dow Corning Corporate Center, P.O. Box 994, Midland, Mich. 48686-0994). Other suitable commercially available adhesion promotion treatments include conventional copper oxide deposition processes such as the Shipley reduced oxide process, "Pro bond-80, available from Shipley Company L.L.C., (455 Forest Street, Marlborough, Mass. 01752), or the copper surface roughness enhancement process known as "BONDFILM™", available from Atotech USA Inc., (500 Science Park Road, State College, Pa., 16801.

Regarding the "BONDFILM™" process, from the standpoint of the chemical process, the non-noble metal (e.g. copper) layer undergoes a combination of micro-roughening and treatment to form an organo-metallic layer on the surface of the non-noble metal (e.g. copper) layer. In the case of copper, the "BONDFILM™" process utilizes a conveyorized machine that microetches the copper to depth of about 1.2 to 1.5 μm, while simultaneously converting the copper at the surface (about 200-300 Angstroms) to the desired organo-metallic structure. The visible result is generally a homogenous medium-brown color. Although BONDFILM™ is known for providing enhanced chemical and mechanical bonding of a copper surface with prepreg material during lamination of multilayer boards, BONDFILM™ and related processes are unknown for uses as described herein including enhanced underfill adhesion.

As described above, in certain embodiments of the invention, the adhesion promoter layer provides a roughened surface. Roughness is generally measured using atomic force microscopy (AFM). Typically, AFM derived roughness is expressed as a root mean square (rms) roughness, $S_q$, defined below:

$$S_q = \sqrt{\frac{1}{MN}\sum_{k=0}^{M-1}\sum_{l=0}^{N-1}[z(x_k, y_l) - \mu]^2}$$

where μ is the mean value of the height, z, across all in-plane coordinates (x,y):

$$\mu = \frac{1}{MN}\sum_{k=0}^{M-1}\sum_{l=0}^{N-1}z(x_k \cdot y_l)$$

As used herein, a roughened surface refers to an rms roughness $S_q$ of at least 2 nm, such as 5 nm, or 10 nm. The roughened surface may also be a porous surface, defined herein as having a porosity of at least 50%.

As described above, the adhesive promoter layer according to embodiments of the invention allows the solder mask layer to be excluded in areas of the workpiece surface corresponding to areas beneath the bumped IC die, thus increasing the height of the gap between the IC die and the workpiece.

The bumped semiconductor die is then attached to the workpiece in step 109. Ultrasonic bonding can be used, such when the IC die bumps are gold stud bumps, to bond the Au stud bump on the Au surface of the substrate. A soldering (reflow) process can be used when at least one of the IC die bumps and the FC pad surface on the workpiece comprise solder. For example, the FC bonding methods described as FC bonding methods 1 and 3 in the background may be used for the soldering process. Step 110 comprises filling the space between the bumped semiconductor die and the workpiece with an underfill material, such as a resin based dielectric material.

Depending on the package type, a subsequent molding step may or may not be performed. For example, certain package on package (POP) packages may not have molding, but chip scale packages (CSP) will generally include the mold compound.

FIG. 2 shows a semiconductor device assembly 200 in a chip scale package (CSP) arrangement according to an embodiment of the invention. Assembly 200 comprises a workpiece 205 comprising a printed circuit board (PCB) bonded to a bumped IC die 210 having a plurality of bumps 211. The workpiece surface includes a die attach area which corresponds to the surface of the workpiece 205 beneath the bumped IC die 210 which comprises a plurality of FC pads 214.

In one embodiment, the bumps 211 comprise noble metal, such as Ni/Au. In another embodiment, the bumps 211 comprise solder. Although the workpiece 205 is shown in FIG. 2 as a single layer circuit board, the circuit board can comprise a multi-layer circuit board. In another embodiment, the workpiece 205 may also be an IC die. Moreover, although only one IC die is shown, embodiments of the invention can include multiple IC die stacked horizontally and/or vertically, such as the POP FC comprising arrangement shown in FIG. 3 described below.

The workpiece 205 generally comprises a dielectric core 206, such as FR4 or other glass reinforced material, or non-glass materials such as fiber reinforced plastics. Workpiece 205 also includes solder mask layer 207 which is on the topside outside the die attach region and the bottomside of core 206, and optional second solder mask layer 208 which acts as a dam/wall on the topside of core 206 to help keep the underfill material 232 within and generally under the bumped die 210, to avoid the underfill 232 from spreading to the periphery of the package, such as to a memory device (not shown) mounted laterally on the same workpiece 205. Solder mask layer 207 is excluded from the die attach area. Workpiece includes non-noble metal comprising regions 215, such as copper regions. The workpiece 205 includes FC pads shown as islands 214. Islands 214 can include a noble metal comprising layer thereon, such as a Ni/Au layer, or a solder comprising layer.

Under the IC die 210 on the metal comprising regions 215 outside the FC pads 214, the workpiece 205 has an adhesion promoter layer 221. The adhesion promoter layer 221 is excluded from the noble metal or solder comprising layer. Underfill material 232 fills the space between the bumped IC die 210 and the workpiece 205. As described above, adding the adhesive promoter layer 221 on the surface of metal (e.g. copper) to workpiece areas under the die 210 according to embodiments of the invention promotes better adhesion of the underfill 232 to the surface of the workpiece 205, can act as a non-oxidizable surface finish that prevents the metal 215 from further oxidizing due to unpredictable environment conditions, and increases the height of the gap between the die 210 and the workpiece 205 reducing voids in the underfill 232 by eliminating the solder mask layer 207 from being under the die 210. As also described above, underfill can be further enhanced when adhesion promoter layer provides a roughened surface.

Figure 3:
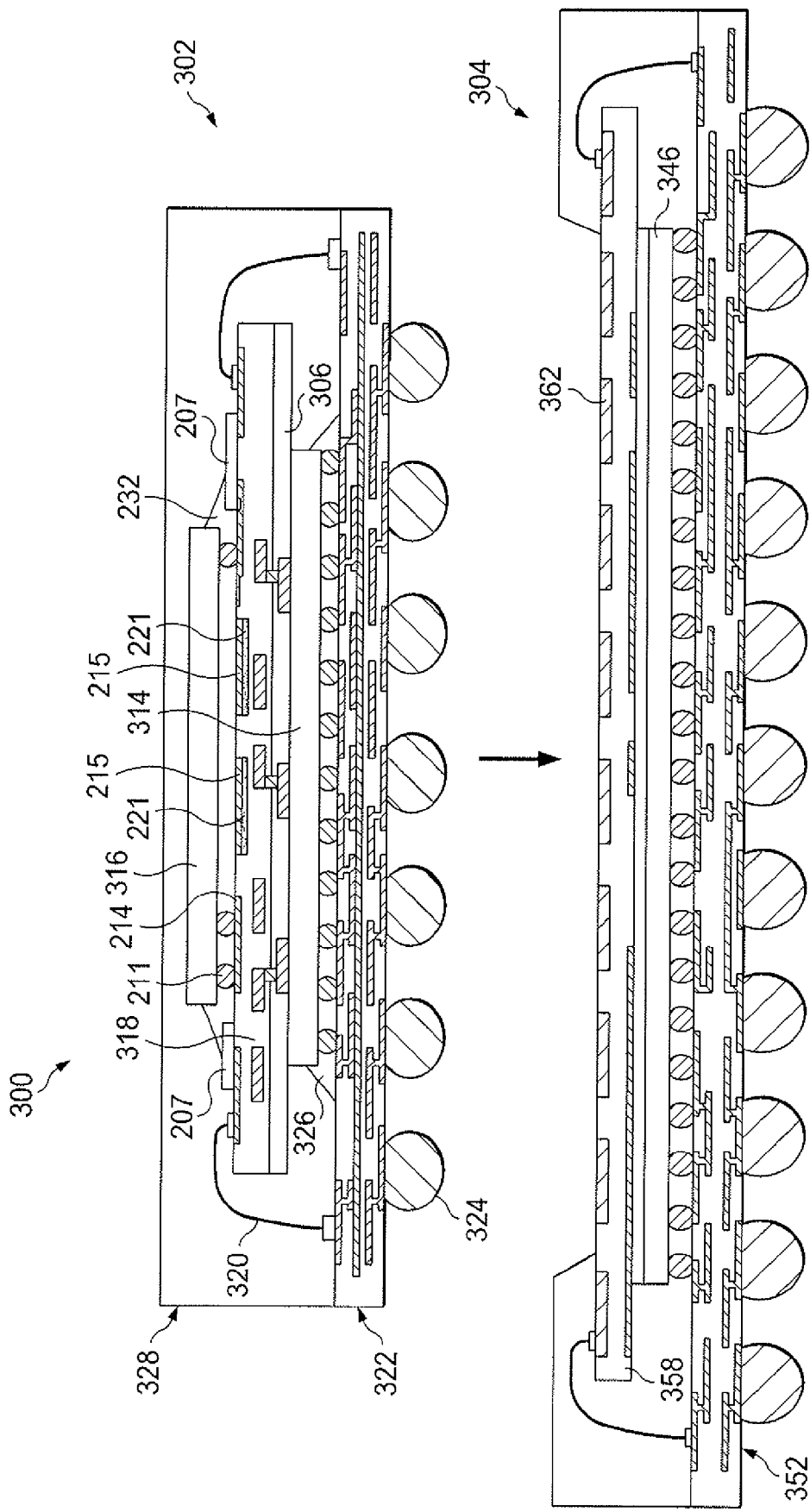
FIG. 3 shows an exploded view of an exemplary multi-chip stacked package on package (POP) packaging system comprising a top package having a die in a FC configuration on top of bottom package, according to another embodiment of the present invention.

FIG. 3 shows an exploded view of an exemplary multi-chip stacked package on package (POP) packaging system 300, according to another embodiment of the present invention. System 300 comprises a top package 302 and a bottom package 304. Top package 302 comprises a pail of IC die 314 and 316, where IC die 316 is in the FC configuration on top of bottom package 304.

Workpiece 306 is shown as a PCB substrate. The workpiece surface includes a die attach area which corresponds to the surface of the workpiece 306 beneath the IC die 316. The die attach area of workpiece 306 includes non-noble metal comprising regions 215, such as copper regions, having adhesion promoter layer 221 thereon in the die attach region. IC die 316 is mounted in a flip-chip configuration, wherein the bumps 211 contact the FC pads 214. The terminals can be connected via bonding wires 320 to terminals on the upper surface of lower workpiece 322 shown as a multi-layer PCB. Workpiece 322 has electrical connections to leads 324. Underfill 326 fills underneath IC die 314. Molding 328 is used to encapsulate die 316 and 314.

Bottom package 304 comprises semiconductor die 346 which is interposed between workpiece 352 which is shown comprising a multi-layer PCB and upper workpiece 358 having surface pads 362. Leads 324 from to package electrically connect to top package to pads 362 of bottom package 304.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A flip chip method for assembling an integrated circuit (IC) die having a plurality of bumps to a workpiece having a surface including a die attach region comprising non-noble metal surfaces and a plurality of flip chip (FC) pads at pad locations, comprising:
    forming a solder mask layer on said surface of said workpiece, wherein said solder mask layer is excluded from said die attach region;
    forming a metal comprising layer on said plurality of FC pads;
    forming an adhesion promoter layer on said non-noble metal surfaces, but not on said plurality of FC pads;
    attaching said bumped IC die in a FC arrangement to said workpiece, and
    filling a space between said bumped semiconductor die and said workpiece with an underfill material.

2. The method of claim 1, wherein said plurality of bumps comprise a noble metal, and wherein said forming a metal comprising layer step comprises selectively forming a layer comprising a noble metal on said plurality of FC pads, but not on said non-noble metal surfaces.

3. The method of claim 2, wherein said forming an adhesion promoter layer comprises etching followed by a chemical conversion process to convert said non-noble surfaces to an organo-metallic layer.

4. The method of claim 1, wherein said non-noble metal surfaces comprises Cu.

5. The method of claim 2, wherein said attaching comprises ultrasonic bonding.

6. The method of claim 1, wherein said workpiece comprises a dielectric or ceramic substrate.

7. The method of claim 1, wherein said workpiece comprises a second IC die.

8. The method of claim 1, wherein said adhesion promoter layer comprises a roughened surface.

9. The method of claim 8, wherein said roughened surface comprises an organometallic copper oxide comprising layer.

10. A flip chip method for assembling an integrated circuit (IC) die having a plurality of noble metal comprising bumps to a workpiece having a surface including a die attach region comprising non-noble metal surfaces and a plurality of flip chip (FC) pads at pad locations, comprising:

forming a solder mask layer onto said surface of said workpiece, wherein said solder mask layer is excluded from said die attach region;

selectively forming a noble metal comprising layer on said plurality of FC pads;

processing said workpiece under conditions to provide an adhesion promoter layer onto said non-noble metal surfaces, wherein said noble metal comprising layer on said plurality of FC pads remains unreacted by said processing;

ultrasonically attaching said IC die in a Fe arrangement to said workpiece, and filling a space between said IC die and said workpiece with an underfill material.

11. A semiconductor device assembly, comprising:
a workpiece having a surface including a die attach region comprising non-noble metal surfaces and a plurality of flip chip (FC) pads at pad locations, a solder mask layer on a surface of said workpiece, wherein said solder mask layer is excluded from said die attach re-ion, wherein said non-noble metal surfaces in said die attach region include an adhesion promoter layer, said adhesion promoter layer absent from said plurality of FC pads;

an integrated circuit (IC) die having a plurality of bumps bonded in a flip chip arrangement to said workpiece, and an underfill material filling a space between said bumped IC die and said workpiece.

12. The semiconductor device assembly of claim 11, wherein said plurality of bumps comprise a noble metal, and said plurality of FC pads comprise a noble metal.

13. The semiconductor device assembly of claim 12, wherein said noble metal for said bumps and said noble metal for said plurality of FC pads comprise gold.

14. The semiconductor device assembly of claim 11, wherein said non-noble metal surfaces comprises Cu.

15. The semiconductor device assembly of claim 14, said adhesion promoter layer comprises a roughened surface.

16. The semiconductor device assembly of claim 15, wherein said roughened surface comprises an organometallic copper oxide comprising layer.

17. The semiconductor device assembly of claim 11, wherein said semiconductor device assembly comprises a chip scale package (CSP).

18. The semiconductor device assembly of claim 11, wherein said semiconductor device assembly comprises a package on package (POP).

* * * * *